(12) United States Patent
Behdjat et al.

(10) Patent No.: US 9,659,809 B2
(45) Date of Patent: May 23, 2017

(54) SUPPORT CYLINDER FOR THERMAL PROCESSING CHAMBER

(71) Applicant: Applied Materials, Inc., Santa Clara, CA (US)

(72) Inventors: Mehran Behdjat, San Jose, CA (US); Aaron Muir Hunter, Santa Cruz, CA (US); Joseph M. Ranish, San Jose, CA (US); Norman Tam, Cupertino, CA (US); Jeffrey Tobin, Mountain View, CA (US); Jiping Li, Palo Alto, CA (US); Martin Tran, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/188,706

(22) Filed: Jun. 21, 2016

(65) Prior Publication Data

US 2016/0300752 A1 Oct. 13, 2016

Related U.S. Application Data

(63) Continuation of application No. 14/298,389, filed on Jun. 6, 2014, now Pat. No. 9,385,004.

(Continued)

(51) Int. Cl.
*H01L 21/687* (2006.01)
*H01L 21/324* (2006.01)
*H01L 21/67* (2006.01)

(52) U.S. Cl.
CPC ...... *H01L 21/68735* (2013.01); *H01L 21/324* (2013.01); *H01L 21/67115* (2013.01); *H01L 21/68757* (2013.01)

(58) Field of Classification Search
CPC ................................................ H01L 21/68757
See application file for complete search history.

(56) References Cited

U.S. PATENT DOCUMENTS 5,960,555 A  10/1999  Deaton et al.
6,048,403 A   4/2000  Deaton et al.
(Continued)

OTHER PUBLICATIONS

International Search Report and Written Opinion for International Application No. PCT/US2014/042025 dated Oct. 6, 2014.

(Continued)

*Primary Examiner* — Caleb Henry
*Assistant Examiner* — Mounir Amer
(74) *Attorney, Agent, or Firm* — Patterson + Sheridan, LLP

(57) ABSTRACT

Embodiments of the disclosure generally relate to a support cylinder used in a thermal process chamber. In one embodiment, the support cylinder includes a hollow cylindrical body comprising an inner peripheral surface, an outer peripheral surface parallel to the inner peripheral surface, wherein the inner peripheral surface and the outer peripheral surface extend along a direction parallel to a longitudinal axis of the support cylinder, and a lateral portion extending radially from the outer peripheral surface to the inner peripheral surface, wherein the lateral portion comprises a first end having a first beveled portion, a first rounded portion, and a first planar portion connecting the first beveled portion and the first rounded portion, and a second end opposing the first end, the second end having a second beveled portion, a second rounded portion, and a second planar portion connecting the second beveled portion and the second rounded portion.

20 Claims, 3 Drawing Sheets

Related U.S. Application Data

(60) Provisional application No. 61/866,379, filed on Aug. 15, 2013.

(56) References Cited

U.S. PATENT DOCUMENTS

| | | |
|---|---|---|
| 6,133,152 A | 10/2000 | Bierman et al. |
| 6,200,388 B1 | 3/2001 | Jennings |
| 6,395,363 B1 | 5/2002 | Ballance et al. |
| 7,081,290 B2 | 7/2006 | Takahashi et al. |
| 7,241,345 B2 | 7/2007 | Ramamurthy et al. |
| 7,378,618 B1 | 5/2008 | Sorabji et al. |
| 7,704,327 B2 | 4/2010 | Waldhauer et al. |
| 2008/0092821 A1 | 4/2008 | Otsuka et al. |
| 2009/0098370 A1 | 4/2009 | Sato et al. |
| 2009/0296774 A1 | 12/2009 | Koelmel et al. |
| 2010/0316858 A1 | 12/2010 | Sato et al. |

OTHER PUBLICATIONS

Office Action for U.S. Appl. No. 14/298,389 dated Jan. 6, 2016.
Final Office Action for U.S. Appl. No. 14/298,389 dated Jul. 1, 2015.

US 9,659,809 B2

SUPPORT CYLINDER FOR THERMAL PROCESSING CHAMBER

CROSS-REFERENCE TO RELATED APPLICATIONS

This application is a continuation of U.S. Ser. No. 14/298,389 filed on Jun. 6, 2014, which claims the benefit of U.S. Provisional Ser. No. 61/866,379, filed Aug. 15, 2013, which are herein incorporated by reference.

BACKGROUND

Field

Embodiments of the present disclosure generally relate to a wafer support cylinder used in a thermal process chamber.

Description of the Related Art

In many semiconductor device manufacturing processes, the required high levels of device performance, yield, and process repeatability can only be achieved if the temperature of the substrate (e.g., a semiconductor wafer) is tightly monitored and controlled during processing of the substrate. Rapid thermal processing (RTP), for example, is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN).

In a RTP chamber, for example, the substrate may be supported on its periphery by an edge of a substrate support ring that extends inwardly from the chamber wall and surrounds a periphery of the substrate. The substrate support ring is rested on a rotatable tubular support cylinder which rotates the substrate support ring and the supported substrate to maximize substrate temperature uniformity during processing. The support cylinder is made of opaque quartz to provide light shielding properties and low thermal conductivity such that heat from the processing area and/or the heating source is substantially attenuated near the support cylinder. The support cylinder is typically coated with a polysilicon layer to render it opaque to radiation in the frequency range used for temperature measurements of the substrate.

However, it has been observed that mismatch in thermal expansion coefficients of polysilicon layer and opaque quartz under high temperatures can cause cracking in the polysilicon layer and/or in the vicinity of the interface between the polysilicon layer and the opaque quartz. Such cracking can be detrimental to the substrate because the cracks may propagate into the underlying quartz which makes the polysilicon layer and a portion of the underlying quartz adhered to the polysilicon layer to peel after thermal cycling. The peeling of the polysilicon layer and the quartz pieces not only compromises opacity of the support cylinder but also contaminates the process chamber and the substrate with particles.

Therefore, there is a need for an improved support cylinder with enhanced light shielding properties that prevents contamination of the process chamber and the substrate during thermal processing.

SUMMARY OF THE INVENTION

Embodiments of the present disclosure generally relate to a support cylinder used in a thermal process chamber. In one embodiment, a support cylinder for a processing chamber is provided. The support cylinder includes a hollow cylindrical body comprising an inner peripheral surface, an outer peripheral surface parallel to the inner peripheral surface, wherein the inner peripheral surface and the outer peripheral surface extend along a direction parallel to a longitudinal axis of the support cylinder, and a lateral portion extending radially from the outer peripheral surface to the inner peripheral surface, wherein the lateral portion comprises a first end having a first beveled portion, a first rounded portion, and a first planar portion connecting the first beveled portion and the first rounded portion, and a second end opposing the first end, the second end having a second beveled portion, a second rounded portion, and a second planar portion connecting the second beveled portion and the second rounded portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to a support cylinder used in a thermal process chamber. The substrate to be thermally processed is supported on its periphery by a support ring. The support ring extends radially inwardly along the inner circumferential surfaces of the process chamber and surrounds a periphery of the substrate. The support ring has an edge lip extending radially inwardly from a surface of the support ring to support the periphery of the substrate from the back side. The support ring has a bottom coupling to a support cylinder. The support cylinder comprises a ring body having an inner peripheral surface and an outer peripheral surface. The outer peripheral surface is further away from a central longitudinal axis of the support cylinder than the inner peripheral surface. The support cylinder may be made of a synthetic black quartz material which is opaque to infrared radiation. In one embodiment, the support cylinder is coated with a clear fused quartz which has high emissivity in the far infrared region. As the clear fused quartz and the underlying synthetic black quartz are all quartz components having similar coefficient of thermal expansion, the inventive support cylinder does not have particle contamination issues due to coefficient of thermal expansion mismatch between an opaque quartz and a polysilicon layer coated thereon, as would normally be seen in the conventional support cylinder. Various embodiments of the support cylinder are discussed in further detail below.

Exemplary Rapid Thermal Processing Chamber

Figure 1:
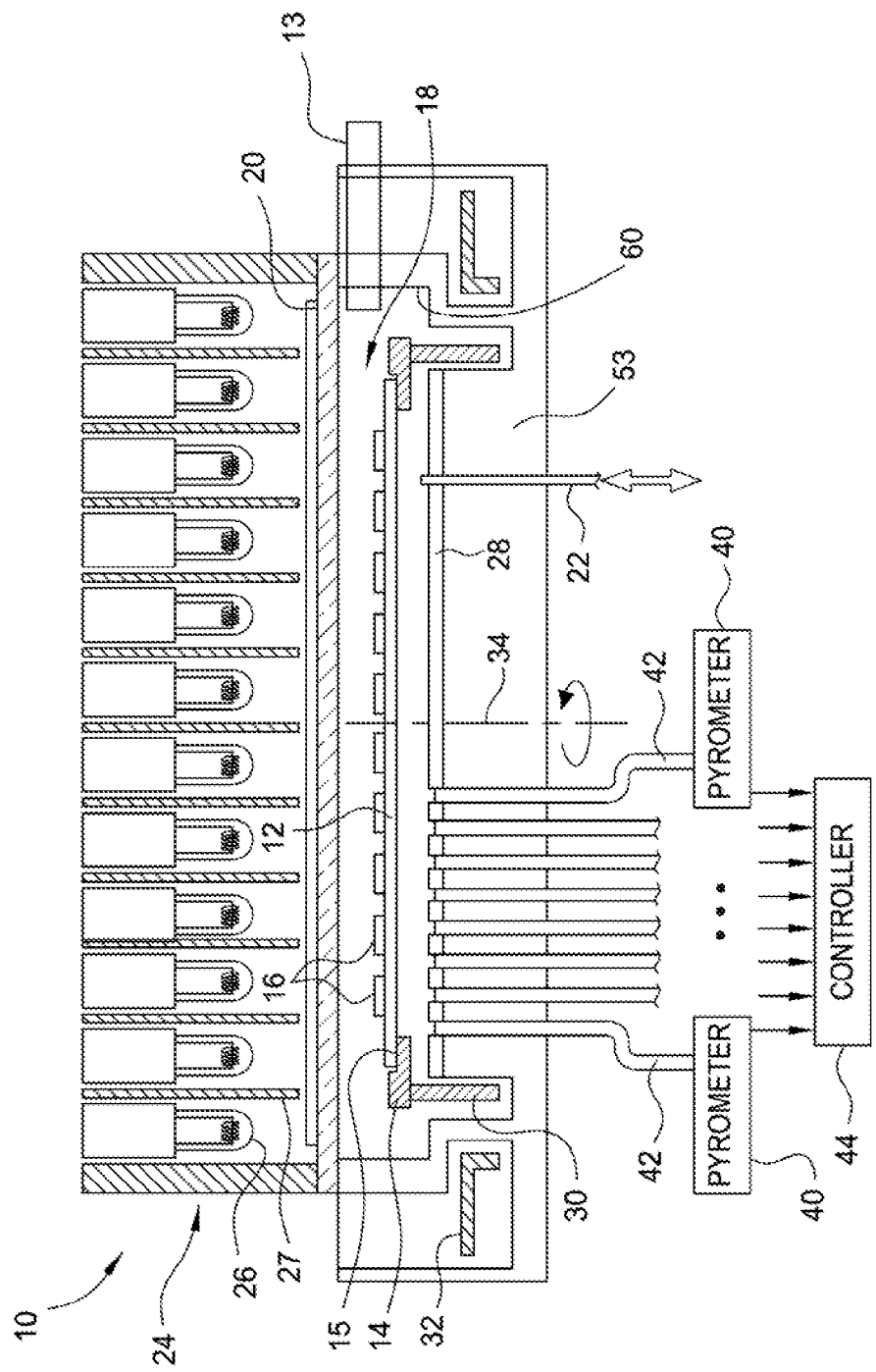
FIG. 1 schematically illustrates a cross-sectional view of a rapid thermal processing chamber.

FIG. 1 schematically depicts a cross-sectional view of a rapid thermal processing chamber 10. Examples of a suitable RTP chamber may include RADIANCE® RTP or CENTURA® RTP chamber, available from Applied Materials, Inc., Santa Clara, Calif. While the processing chamber 10 shows a top heating configuration (i.e., heating lamps provided relatively above the substrate), it is contemplated that a bottom heating configuration (i.e., heating lamps provided relatively below the substrate) may also be utilized to benefit from the present disclosure. A substrate 12, for example, a semiconductor substrate such as a silicon substrate, to be thermally processed is passed through the valve or access port 13 into the process area 18 of the processing chamber 10. The substrate 12 is supported on its periphery by an annular support ring 14. An edge lip 15 extends inward of the annular support ring 14 and contacts a portion of the backside of the substrate 12. The substrate may be oriented such that processed features 16 already formed in a front surface of the substrate 12 face upwardly toward a process area 18 defined on its upper side by a transparent quartz window 20. The front surface of the substrate 12 is facing toward the array of lamps 26. In some embodiments, the front surface of the substrate 12 with the processed featured formed thereon may face away from the array of lamps 26, i.e., facing towards the pyrometers 40. Contrary to the schematic illustration, the features 16 for the most part do not project substantial distances beyond the front surface of the substrate 12 but constitute patterning within and near the plane of the front surface.

A plurality of lift pins 22, such as three lift pins, may be raised and lowered to support the back side of the substrate 12 when the substrate is handed between a paddle or robot blade (not shown) bringing the substrate into the processing chamber and onto the support ring 14. A radiant heating apparatus 24 is positioned above the window 20 and configured to direct radiant energy toward the substrate 12 through the window 20. In the processing chamber 10, the radiant heating apparatus may include a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, it is contemplated that other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that emits radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical ramp-down (cooling) rates in RTP chambers are in the range of about 80° C./second to 150° C./second. Some processes performed in RTP chambers require variations in temperature across the substrate of less than a few degrees Celsius. Thus, an RTP chamber must include a lamp or other suitable heating system and heating system control capable of heating at rate of up to about 100° C./second to 150° C./second, and about 200° C./second to 400° C./second, distinguishing rapid thermal processing chambers from other types of thermal chambers that do not have a heating system and heating control system capable of rapidly heating at these rates. An RTP chamber with such a heating control system may anneal a sample in less than 5 seconds, for example, less than 1 second, and in some embodiments, milliseconds.

It is important to control the temperature across the substrate 12 to a closely defined temperature uniform across the substrate 12. One passive means of improving the uniformity may include a reflector 28 disposed beneath the substrate 12. The reflector 28 extends parallel to and over an area greater than the substrate 12. The reflector 28 efficiently reflects heat radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity is advantageously greater than 20. The top of reflector 28, which may be made of aluminum and has a highly reflective surface coating or multi-layer dielectric interference mirror, and the back side of the substrate 12 form a reflecting cavity for enhancing the effective emissivity of the substrate, thereby improving the accuracy of temperature measurement. In certain embodiments, the reflector 28 may have a more irregular surface or have a black or other colored surface to more closely resemble a black-body wall. The reflector 28 may be deposited on a second wall 53, which is a water-cooled base made of metal to heat sink excess radiation from the substrate, especially during cool down. Accordingly, the process area of the processing chamber 10 has at least two substantially parallel walls, of which a first is a window 20, made of a material being transparent to radiation such as quartz, and the second wall 53 which is substantially parallel to the first wall and made of metal significantly not transparent.

One way of improving the uniformity includes supporting the support ring 14 on a rotatable support cylinder 30 that is disposed radially inward of the inner circumferential surfaces 60 of the processing chamber 10. The support cylinder 30 is magnetically coupled to a rotatable flange 32 positioned outside the processing chamber 10. A motor (not shown) rotates the flange 32 and hence rotates the substrate about its center 34, which is also the centerline of the generally symmetric chamber. Alternatively, the bottom of the support cylinder 30 may be magnetically levitated cylinder held in place by magnets disposed in the rotatable flange and rotated by rotating magnetic field in the rotatable flange 32 from coils in the rotable flange 32.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the substrate 12 through apertures in the reflector 28 to measure the temperature across a radius of the rotating substrate 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity $\in$ can vary between 1 for a black body to 0 for a perfect reflector and thus is an inverse measure of the reflectivity $R=1-\in$ of the substrate back side. While the back surface of a substrate is typically uniform so that uniform emissivity is expected, the backside composition may vary depending upon prior processing. The pyrometry can be improved by further including a emissometer to optically probe the substrate to measure the emissivity or reflectance of the portion of the substrate it is facing in the relevant wavelength range and the control algorithm within the controller 44 to include the measured emissivity.

Exemplary Support Cylinder

Figure 2A:
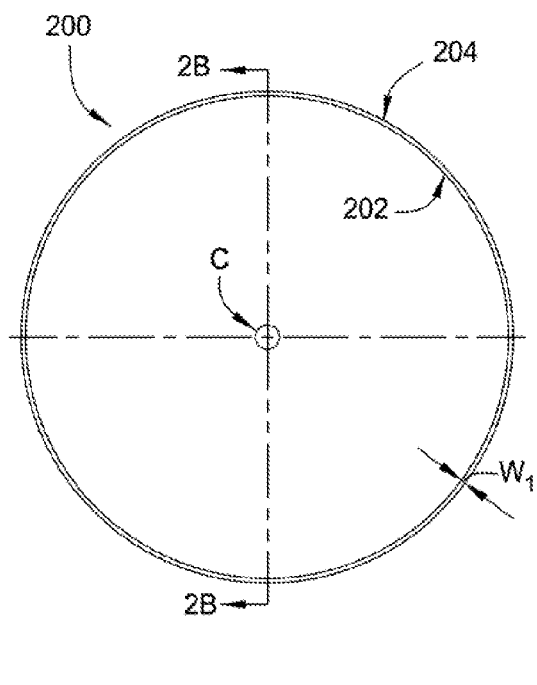
FIG. 2A is a schematic top view of a support cylinder that may be used in place of the support cylinder of FIG. 1 according to one embodiment of the disclosure.

FIG. 2A is a schematic top view of a support cylinder 200 that may be used in place of the support cylinder 30 of FIG. 1 according to one embodiment of the disclosure. The support cylinder 200 illustrated in FIG. 2A may be disposed within a processing chamber, for example a rapid thermal processing chamber 10 shown in FIG. 1. The support cylinder 200 is generally a continuous ring body with a substantially consistent radial width "W". The support cylinder 200 has an inner peripheral surface 202 and an outer peripheral surface 204 parallel to the inner peripheral surface 202. The outer peripheral surface 204 is further away from a central longitudinal axis "C" of the support cylinder 200 than the inner peripheral surface 202. While not shown, the support cylinder 200 is sized such that the outer peripheral surface 204 is disposed radially inward of the inner circumferential surfaces of the processing chamber, as discussed above with respect to FIG. 1.

Figure 2B:
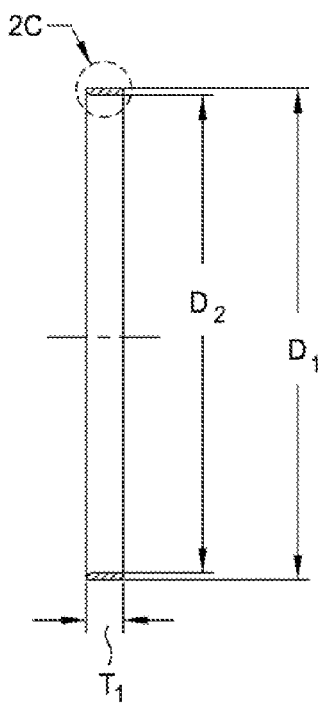
FIG. 2B is a sectional view of the support cylinder taking along the line 2B-2B of FIG. 2A.
Figure 2C:
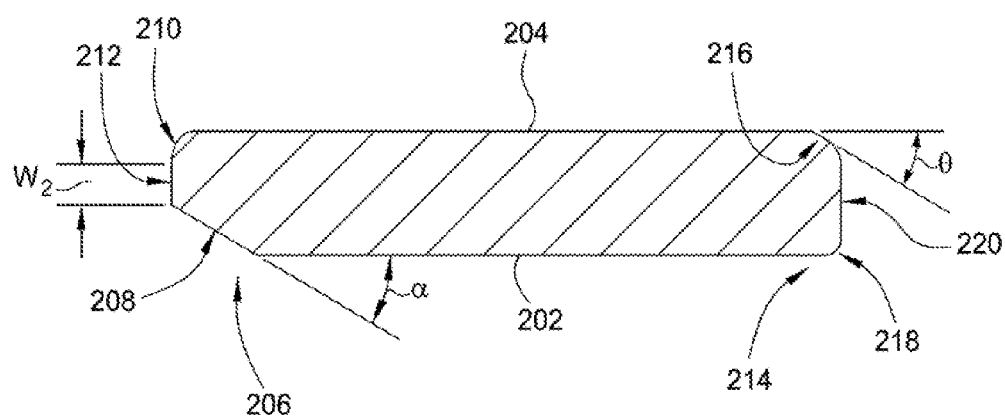
FIG. 2C is an enlarged view of a portion "2C" of the support cylinder shown in FIG. 2B.

FIG. 2B is a sectional view of the support cylinder 200 taking along the line 2B-2B of FIG. 2A. FIG. 2C is an enlarged view of a portion "2C" of the support cylinder 200 shown in FIG. 2B. For a 300 mm substrate, the support cylinder 200 may have an outer diameter "$D_1$" (measuring from the outer peripheral surface 204) of about 310 mm to about 360 mm, for example about 330 mm, and an inner diameter "$D_2$" (measuring from the inner peripheral surface 202) of about 305 mm to about 350 mm, for example about 324 mm. The support cylinder 200 may have a thickness "$T_1$" (FIG. 2B) of about 10 mm to about 80 mm, for example about 24 mm. The support cylinder 200 may have a radial width ($W_1$) of about 2.5 mm to about 35 mm, for example about 6 mm. In general, the dimension of the radial width (W) is selected to ensure that the support ring (i.e., the support ring 14 of FIG. 1) to be placed thereon does not slip off the support cylinder 200 when the support cylinder 200 and the support ring rotate during the process. It is contemplated that the foregoing dimensions may vary if a larger or smaller substrate and/or processing chamber are used.

In one embodiment shown in FIG. 2C, the first end 206 of the support cylinder 200 may have a beveled surface portion 208 and a rounded surface portion 210. The rounded surface portion 210 may have a radius of about 0.25 mm to about 0.5 mm to reduce mechanical stress in the support cylinder 200. The beveled surface portion 208 connects to the rounded surface portion 210 through a planar surface 212 which extends radially from the outer peripheral surface 204 to the inner peripheral surface 202 of the support cylinder 200. The beveled surface portion 208 is sloped downwardly toward the inner peripheral surface 202 at an angle "α" of about 15° to about 40°, for example about 30°, with respect to the inner peripheral surface 202. The planar surface 212 may have a width "$W_2$" of about 0.5 mm. The planar surface 212 is configured to be in physical contact with a support ring (not shown) that supports a semiconductor substrate. Therefore, the support cylinder 200 only contacts the support ring with the planar surface 212 to substantially reduce the contact area available for conductive transfer of heat between the support cylinder 200 and the support ring (and therefore the substrate).

Similarly, the second end 214 of the support cylinder 200 may have a beveled surface portion 216 and a rounded surface portion 218. The beveled surface portion 216 connects to the rounded surface portion 218 through a planar surface 220 which extends radially from the outer peripheral surface 204 to the inner peripheral surface 202 of the support cylinder 200. The beveled surface portion 216 is sloped downwardly toward the outer peripheral surface 204 at an angle "θ" of about 15° to about 40°, for example about 30°, with respect to the outer peripheral surface 204. The planar surface 220 is configured to couple to a magnetic rotor (not shown), which is magnetically coupled to the rotatable flange 32 (FIG. 1) to induce rotation of the magnetic rotor and hence of the support cylinder 200, the support ring and the supported substrate about the central longitudinal axis "C" of the support cylinder 200.

The beveled surface portions of the support cylinder 200 may be formed using a laser machining technique or any suitable technique. Instead of using the planar surface 212 to contact the support ring, the first end 206 of the support cylinder 200 may be configured to provide a bump or a projection having a limited contact area for conductive transfer of heat between the support cylinder 200 and the support ring to be placed thereon. The bump or projection may be any suitable shape such as rectangular, rhombus, square, hemispherical, hexagonal, or triangular protrusions. Hemispherical-shaped bumps or projections may be advantageous in terms of effective thermal mass reduction since hemispherical-shaped bumps or projections further reduce the surface contact area between the support cylinder 200 and the support ring (and therefore the substrate placed thereon) by turning the surface contact into a point contact. The shape and/or dimension of the planar surface 212 (or bumps/protrusions if used) may vary so long as the support ring is supported securely with minimized contact area between the substrate support and the support cylinder 200.

In one embodiment, the support cylinder 200 is made of an opaque quartz glass material. The opaque quartz glass material may have microscopically small gas inclusions or voids in high concentrations to make the support cylinder 200 opaque to radiation in the frequency range of the pyrometer (e.g., pyrometers 40 of FIG. 1) used for temperature measurements of the substrate. The term "opaque" used herein may refer to quartz glasses having an apparent density ranging from 1.7-2.2 g/cm$^3$, an average bubble or gas inclusion diameter ranging from 10 to 100 µm, and a bubble or gas inclusion content of 6×10$^5$ to 9×10$^8$ bubbles/cm$^3$. As the opaque quartz glass material is able to block out radiation from external sources that might disturb the temperature measurements, the accuracy of the temperature measurement of the substrate is improved. In addition, a support cylinder made of the opaque quartz glass material has higher thermal resistivity which cuts down the conduction of heat from the center of the support cylinder 200 to the surrounding components such as the support ring. The gas inclusions or voids in the opaque quartz glass material also scatter the light trapped in the quartz to avoid the support cylinder 200 becoming a heat sink. One exemplary opaque quartz glass material is synthetic black quartz (SBQ), available from Heraeus Quarzglas GmbH & Co. KG, Germany. Alternatively, the opaque quartz glass material may be made with microscopic solid particles ZrO$_2$ and HfO$_2$ in addition to, or other than those made from gas inclusions or voids of various shapes. The synthetic black quartz is thermally insulating, dimensionally stable at high temperatures, and inherently opaque to infrared radiation in the frequency range of the pyrometer (e.g., pyrometers 40 of FIG. 1) to avoid undesirable interference with the pyrometer signal from the substrate. Particularly, the synthetic black quartz material has low coefficient of thermal expansion (about 5.1×10$^{-7}$/° C.) so that the support cylinder 200 and the coating layer to be formed thereon (will be discussed below) have a coefficient of thermal expansion that is substantially matched or similar to each other to reduce thermal expansion mismatch, which may cause thermal stress under high thermal loads. The synthetic black quartz material also has very low impurity level. The low impurity level as described herein refers to a highly pure black quartz where the total content of metal impurities such as Na, K, Li, Al, Fe, Cu, Mg, Ca, and Ti is below 5 wt ppm or less. Some of properties of the synthetic black quartz material are provided in Table 1.

In some embodiments, the opaque quartz glass material may be obtained by heating and burning a quartz glass porous body under a vacuum, under an atmospheric pressure, or under a high pressure of 0.05 MPa or higher (e.g., 1000 MPa) at high temperatures such as between about 900° C. to about 2500° C.

Other variations of the support cylinder 200 using the synthetic black quartz material are also contemplated. For example, the support cylinder 200 may be a core body made of clear quartz, silicon carbide, silicon-impregnated silicon carbide or the like, with a coating layer made of the synthetic black quartz material as discussed above covering most exposed surface of the core body.

Figure 3:
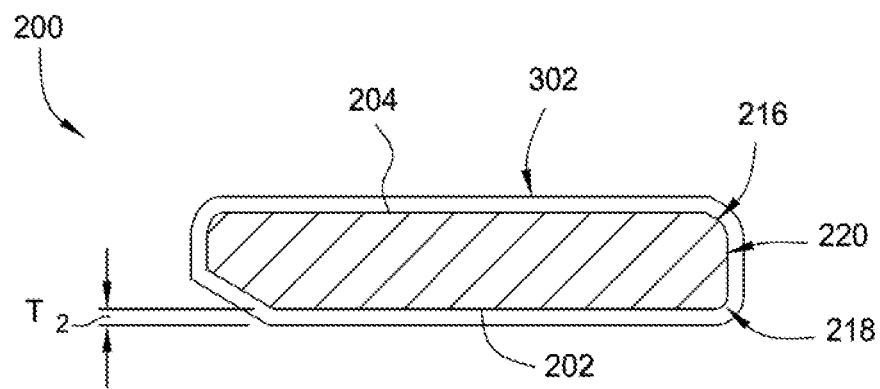
FIG. 3 depicts a schematic side view of a portion of the support cylinder shown in FIG. 2B according to one embodiment of the disclosure.

FIG. 3 depicts a schematic side view of a portion of the support cylinder 200 shown in FIG. 2B according to another embodiment of the disclosure. In this embodiment, the support cylinder 200 is further coated with an optical transparent layer, for example a clear fused quartz material 302. The clear fused quartz material 302 may have a refractive index of about 1.5. The clear fused quartz material layer 302 may have a thickness "T$_2$" of about 30 µm to about 200 µm, for example about 100 µm. The clear fused quartz material layer 302 may cover the most exposed surfaces of the support cylinder 200 except for the beveled surface portion 216, the planar surface 220 and the rounded surface portion 218, which are the locations to be coupled to a rotor or other components. Alternatively, the clear fused quartz material layer 302 may cover the entire surface of the support cylinder 200. The clear fused quartz material layer 302 is selected as it has low coefficient of thermal expansion (about 5.5×10$^{-7}$/° C.) in the relevant temperature range of about 300° C. to about 1450° C. The clear fused quartz material layer may have a purity of at least 99.9% by weight of SiO$_2$.

Providing a clear fused quartz material layer on the support cylinder 200 that is also made of quartz material (i.e., synthetic black quartz) is advantageous because the clear fused quartz material layer 302 exhibit good adhesion

TABLE 1

| Electric resistance (Ω · cm) at 500° C. | Thermal diffusion ratio (×10$^{-4}$ m$^2$/s) | Heat conductivity (w/(m · k)) | Thermal expansion (×10$^{-7}$/° C.) at 500° C. | Density (g/cm$^3$) | Bending strength (N/mm$^2$) | Young's modulus (Gpa) | Dielectric constant ∈ (at 500 MHz) |
|---|---|---|---|---|---|---|---|
| 1.51*10$^{12}$ | 0.00816 | 1.31 | 5.1 | 2.204 | 163 | 73.0 | 3.87 |

In some embodiments, the synthetic black quartz may be made by adding a blackening element or compound to a material of quartz glass. Suitable compounds may include V, Mo, Nb, C, Si, iron oxides or tungsten. The amount of the blackening element added is not particularly limited, but is generally 0.1 to 10% by weight based on the weight of the quartz glass. In some embodiments, the synthetic black quartz may be made by thermal spraying quartz glass or black silica on a substrate such as quartz glass, metals or ceramics. The support cylinder with such a black quartz glass thermal sprayed film formed on a substrate have excellent far infrared radiation property as well as excellent light shielding property and heat shielding property. If desired, an opaque quartz glass thermal sprayed film may be further laminated on the black quartz glass thermal sprayed film. The black quartz glass thermal sprayed film laminated with such an opaque quartz glass thermal sprayed film scatters infrared rays and is impervious to visible rays, and therefore it is more effective for heat insulation property.

to the underlying synthetic black quartz material. Most importantly, the clear fused quartz material layer 302 has a coefficient of thermal expansion that is substantially matched or similar to the underlying synthetic black quartz material, thereby reducing or even avoiding the thermal stress on the support cylinder that can otherwise lead to cracking in the coating and rapid part degradation that compromises opacity and particle issues. The clear fused quartz material layer 302 also improves the emissivity of the support cylinder 200 in the infrared range. By increasing the emissivity of the support cylinder 200 in the infrared range, the support cylinder 200 can be heated more quickly so that the support cylinder 200 does not act as a thermal load taking away heat from the support ring and become a heat sink that might disturb the temperature measurements of the substrate.

Figure 4:
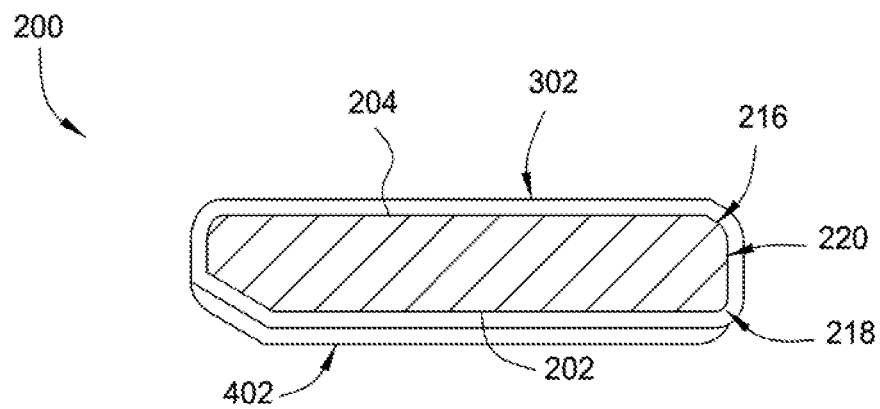
FIG. 4 depicts a schematic side view of a portion of the support cylinder shown in FIG. 3 using a reflective coating layer according to another embodiment of the disclosure.

For rapid thermal processing chambers that adapt a bottom heating type configuration (i.e., the substrate is held with its back surface in opposition to a radiant heat source while its upper surface on which the features such as integrated circuits face away from the radiant heat source), the support cylinder may further have a reflective coating layer formed on or part of the clear fused quartz material layer to control the temperature distribution of the support cylinder 200. FIG. 4 depicts a schematic side view of a portion of the support cylinder 200 shown in FIG. 3 using a reflective coating layer according to yet another embodiment of the disclosure. It has been observed that the support cylinder 200 may become too hot and deform upon direct exposure to the radiant heat source, which in turn may cause the support ring and hence the supported substrate to shift horizontally. Therefore, the substrate temperature uniformity is undesirably affected. To prevent the support cylinder 200 from getting too hot, a reflective coating layer 402 may be applied onto the clear fused quartz material layer 302 on the inner peripheral surface 202 facing the radiant heat source so that the heat radiation is reflected back to the heating lamps to help the support cylinder 200 maintain at a lower temperature during processing. The reflective coating layer 402 may cover about 20% to about 100% surface area of the inner peripheral surface 202. In various examples, the reflective coating layer 402 may cover about 25%, about 30%, about 40%, about 50%, about 60%, about 70%, about 80%, about 90%, about 95% surface area of the inner peripheral surface 202. In some cases, the reflective coating layer 402 may cover the entire surface of the support cylinder 402 to assist in heat dissipation from the support cylinder 200. Such a reflective coating layer 402 may be uniform over the inner peripheral surface 202 of the support cylinder 200 as shown, or it may be non-uniformly applied to counteract the non-uniformity of the infrared radiation from the radiant heat source impinging on the support cylinder 200. In either case, the reflective coating layer 402 may have a thickness "$T_3$" of about 20 μm to about 150 μm, for example about 60 μm.

The materials selected to fabricate the reflective coating layer 402 may have a coefficient of thermal expansion that is substantially matched or similar to the intermediate clear fused quartz material layer 302 to reduce thermal expansion mismatch, which may otherwise cause thermal stress in the layer accompanied with cracking under high thermal loads. Exemplary materials that may be used for the reflective coating layer 402 may include fused silica, borosilicate glass, or the like.

Although exemplary embodiments of the present disclosure are shown and described, those of ordinary skill in the art may devise other embodiments which incorporate the present disclosure, and which are also within the scope of the present disclosure. For example, the reflective coating layer 402 may be replaced with a heat absorptive coating layer to assist in heat dissipation from the support cylinder 200 by absorbing heat radiation from the radiant heat source and/or one or more components in the processing chamber. The material of the heat absorptive coating layer may be selected to absorb thermal radiation at a wavelength of 1 micron to 4 micron, or other wavelengths of interest. Some possible materials may include polyurethane material, carbon black paint or a composition including graphite.

Figure 5:
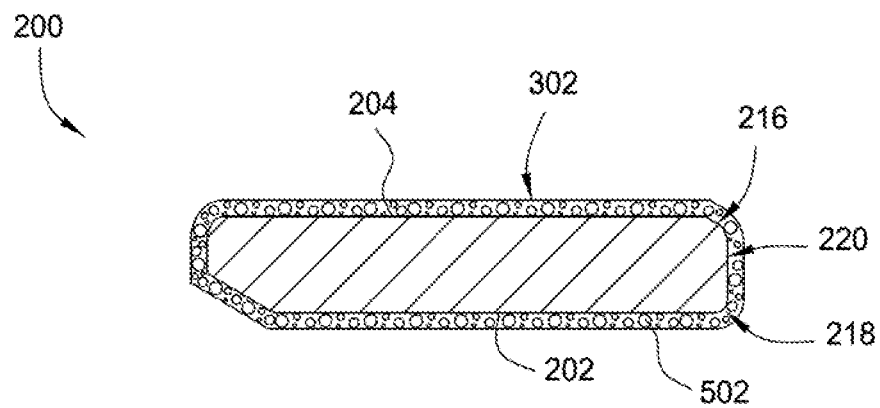
FIG. 5 depicts a schematic side view of a portion of the support cylinder shown in FIG. 3 according to yet another embodiment of the disclosure.

Alternatively, instead of using the reflective coating layer 402, the intermediate clear fused quartz material layer 302 may be doped with atoms 502 (FIG. 5) which absorb radiation from the radiant heat source and/or one or more components in the processing chamber. The atoms 502 may be evenly provided within the clear fused quartz material 302 at the inner peripheral surface 202, or over the entire clear fused quartz material 302 as shown in FIG. 5. The doping may result in a more uniform temperature profile of the support cylinder 200, if the dopants are uniformly distributed over the inner peripheral surface 202 or the entire surface of the support cylinder 200.

While the foregoing is directed to embodiments of the present disclosure, other and further embodiments of the disclosure may be devised without departing from the basic scope thereof, and the scope thereof is determined by the claims that follow.

The invention claimed is:

1. A support cylinder for a processing chamber, comprising:
   a hollow cylindrical body comprising:
      an inner peripheral surface;
      an outer peripheral surface parallel to the inner peripheral surface, wherein the inner peripheral surface and the outer peripheral surface extend along a direction parallel to a longitudinal axis of the support cylinder; and
      a lateral portion extending radially from the outer peripheral surface to the inner peripheral surface, wherein the lateral portion comprises:
         a first end having a first portion, a second portion, and a first planar portion between the first portion and the second portion; and
         a second end opposing the first end, the second end having a first portion, a second portion, and a second planar portion between the first portion of the second end and the second portion of the second end.

2. The support cylinder of claim 1, wherein the second portion of the first end has a radius of about 0.25 mm to about 0.5 mm.

3. The support cylinder of claim 1, wherein the first portion of the first end is sloped toward the inner peripheral surface at an angle with respect to the inner peripheral surface.

4. The support cylinder of claim 3, wherein the angle is about 15° to about 40°.

5. The support cylinder of claim 1, wherein the first portion of the second end is sloped toward the outer peripheral surface at an angle with respect to the outer peripheral surface.

6. The support cylinder of claim 5, wherein the angle is about 15° to about 40°.

7. The support cylinder of claim 1, wherein the first planar portion has a bump or a projection.

8. The support cylinder of claim 7, wherein the projection has a shape of rectangular, rhombus, square, hemispherical, hexagonal, or triangular.

9. The support cylinder of claim 1, wherein the hollow cylindrical body is made of opaque quartz glass material.

10. The support cylinder of claim 1, wherein the hollow cylindrical body comprises silica.

11. The support cylinder of claim 1, wherein the hollow cylindrical body is a quartz glass having a coating of silica.

12. The support cylinder of claim 1, wherein the hollow cylindrical body is formed from a clear quartz, a silicon carbide, or a silicon-impregnated silicon carbide.

13. The support cylinder of claim 1, wherein the hollow cylindrical body is coated with an optical transparent layer.

14. The support cylinder of claim 13, wherein the optical transparent layer is a clear fused quartz.

15. The support cylinder of claim 13, wherein the optical transparent layer covers exposed surfaces of the hollow cylindrical body except the first portion of the second end, the second portion of the second end, and the second planar portion.

16. The support cylinder of claim 13, wherein the optical transparent layer formed on the inner peripheral surface is covered by a reflective coating layer.

17. The support cylinder of claim 16, wherein the reflective coating layer is a fused silica, borosilicate glass.

18. The support cylinder of claim 13, wherein the optical transparent layer formed on the inner peripheral surface is covered by a heat absorptive coating layer absorbing thermal radiation at a wavelength of 1 micron to 4 micron.

19. The support cylinder of claim 18, wherein the heat absorptive coating layer made of polyurethane material, carbon black paint or a composition including graphite.

20. The support cylinder of claim 1, wherein the first portion of the first end is beveled, the second portion of the first end is rounded, the first portion of the second end is beveled, and the second portion of the second end is rounded.

* * * * *